United States Patent [19]

Hung et al.

[11] Patent Number: 5,776,623

[45] Date of Patent: Jul. 7, 1998

[54] TRANSPARENT ELECTRON-INJECTING ELECTRODE FOR USE IN AN ELECTROLUMINESCENT DEVICE

[75] Inventors: Liang-Sun Hung, Webster; Ching Wan Tang; Joseph Kuru Madathil, both of Rochester, all of N.Y.

[73] Assignee: Eastman Kodak Company, Rochester, N.Y.

[21] Appl. No.: 681,734

[22] Filed: Jul. 29, 1996

[51] Int. Cl.[6] .................. H05B 33/04; B32B 15/04
[52] U.S. Cl. .................. 428/690; 313/502; 313/503; 313/504; 313/505; 313/506; 428/209; 428/457; 428/691; 428/917
[58] Field of Search ....................... 313/502, 503, 313/504, 505, 506; 428/457, 690, 691, 917, 209

[56] References Cited

U.S. PATENT DOCUMENTS

| | | | |
|---|---|---|---|
| 4,885,211 | 12/1989 | Tang et al. | 313/504 |
| 5,409,783 | 4/1995 | Tang et al. | 428/690 |
| 5,648,181 | 7/1997 | Watanabe | 428/690 |
| 5,652,067 | 7/1997 | Ito et al. | 428/690 |

*Primary Examiner*—John M. Cooney, Jr.
*Attorney, Agent, or Firm*—Raymond L. Owens

[57] ABSTRACT

An electroluminescent device containing a transparent electron-injecting electrode is disclosed. The electrode includes a thin nonconductive layer contacting the electroluminescent layer, a conductive transparent overcoat layer, and the thickness of the nonconductive layer being selected so that the bilayer acts as an electron injecting contact, the bilayer providing stability against atmospheric corrosion.

25 Claims, 2 Drawing Sheets

5,776,623

TRANSPARENT ELECTRON-INJECTING ELECTRODE FOR USE IN AN ELECTROLUMINESCENT DEVICE

CROSS REFERENCE TO RELATED APPLICATION

Reference is made to commonly assigned U.S. Ser. No. 08/681,680, filed concurrently and entitled "Bilayer Electron-Injecting Electrode For Use in an Electroluminescent Device" to Hung et al, and commonly-assigned U.S. Ser. No. 08/681,565, filed concurrently and entitled "Bilayer Electrode on a N-type Semiconductor" by Hung et al, which is now U.S. Pat. No. 5,677,572 the disclosures of which are incorporated by reference.

FIELD OF THE INVENTION

The present invention relates to transparent electron-injecting electrodes which are particularly effective for use with organic LED devices used in electroluminescent structures.

BACKGROUND OF THE INVENTION

There is increasing interest in the fabrication of organic electroluminescent (EL) devices which are capable of emitting light from the top surface. One important application is to achieve monolithic integration with an array of organic EL devices on an active semiconductor substrate where driver electronics and pixel switching elements are incorporated.

In a normal configuration, the organic EL device is constructed on a transparent substrate such as a piece of glass through which the light emitted by the device is viewed. Thus, the EL structure comprises, in sequence, a glass support, a transparent conductive hole-injecting electrode, organic EL layers, and an electron-injecting electrode. The electron-injecting electrode, which constitutes the top layer of the EL structure, is generally not required to be light-transmissive. However, when a semiconductor wafer such as Si is used as the substrate, the light emission through the substrate is blocked. It is therefore necessary that the electron-injecting cathode is made light-transmissive, so that the EL light can exit through this layer. The configuration is commonly known as surface-emitting EL device.

It is the object of the invention to provide a bilayer structure which is highly transmissive and acts as an effective electron-injecting electrode in an organic EL device. The structure consists of a thin layer of metal fluorides or oxides and a layer of electrically conductive films.

It is another object of this invention to provide an effective electron injecting contact which is stable and resistant to atmosphere oxidation or corrosion.

SUMMARY OF THE INVENTION

It is an object of the present invention to provide a transparent electron-injecting electrode for use with an electroluminescent device.

This object is achieved in an electroluminescent device containing a transparent electron-injecting electrode, the electrode comprising:

a) a thin nonconductive layer contacting the electroluminescent layer, b) a conductive transparent overcoat layer; and c) the thickness of the nonconductive layer being selected so that the bilayer acts as an electron injecting contact, the bilayer providing stability against atmospheric corrosion.

Specifically, when the invention is embodied in an organic electroluminescent device, the device has a conductive hole-injecting anode, an organic electroluminescent layer, and a top transparent electron-injecting electrode in contact with the organic electroluminescent layer, the electrode comprising:

a) a fluoride or a oxide layer contacting the organic layer;

b) a transparent conductive overcoat layer over the fluoride or oxide layer; and c) the thickness of the fluoride or oxide layer being selected so that the bilayer acts as an electron injecting contact, the bilayer providing stability against atmospheric corrosion.

ADVANTAGES OF THE INVENTION

There are a number of metal oxides having high electrical conductivity and low absorbance to visible light, however, these materials generally have a high work function, thus precluding their use for electron injection. The disclosed structures combine those oxides with a thin layer of alkali or alkaline earth fluorides or oxides to form a desirable transparent electron injector.

In general, one can invert the structure to make a surface emitting diode, where the device comprises in order: a substrate, an electron injector, an organic single layer or multilayer structure for electroluminescence and carrier confinement, and a layer of high-work-function material as a hole injector which is transmissive to optical radiation. However, the inverted structures may cause problems, such as structure incompatibility and degraded device performance. In this invention, the surface-emitting diode without layer reversal is disclosed.

DETAILED DESCRIPTION OF THE INVENTION

Figure 1:
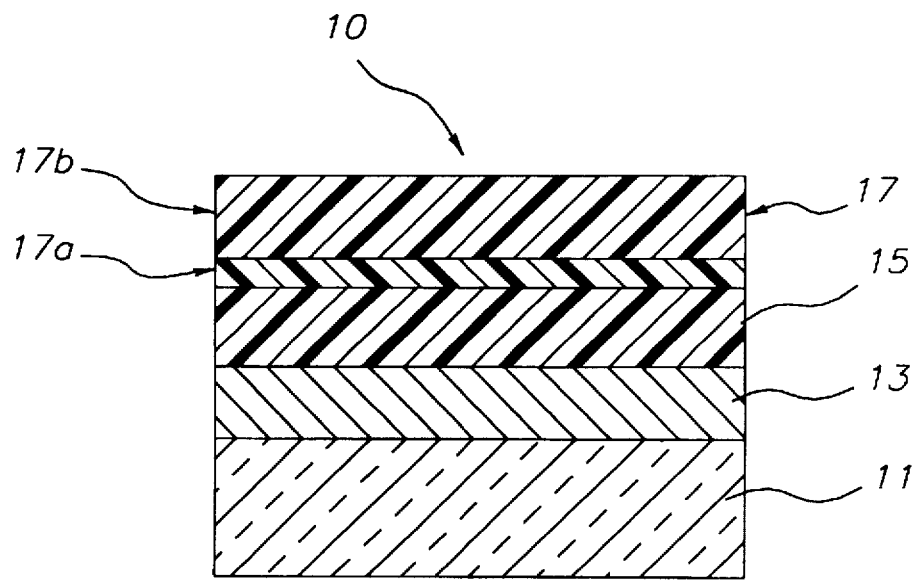
FIG. 1 is a schematic diagram of an embodiment of the electroluminescence device of the invention.

Referring to FIG. 1, an electroluminescence device 10 of the invention has, in order, a substrate 11, a bottom hole-injecting electrode 13, an organic layer structure 15, a top electron-injecting electrode 17. The top electrode includes a fluoride or fluoride layer 17a and a conductive overlayer 17b.

Substrate 11 is a single crystal semiconductor substrate selected from the group consisting of Si, Ge, GaAs, GaP, GaN, GaSb, InAs, InP, InSb, or $Al_xGa_{1-x}As$, where x is from 0 to 1. Substrate 11 can be either undoped, lightly doped, or heavily doped. Substrate 11 is either bare or covered with a layer of dielectric material such as Si oxides or Si nitrides. In some applications, part of the semiconductor can be used as substrate 11 for electroluminescent device 10, while the remainder of the semiconductor wafer can be processed to form drivers, switches, or other electronic circuitry.

Bottom hole-injecting electrode layer 13 acts as a hole injector having a high work function with a value greater than 4.2 eV and good stability in ambient. This layer 13 is either a conductive oxide or a metal layer. Suitable metal oxides include indium-tin-oxide, aluminum- or indium-doped zinc oxide, tin oxide, magnesium-indium-oxide, nickel-tungsten oxide, and cadmium-tin-oxide. Suitable metals include gold, silver, nickel, palladium, and platinum. The desired metal oxides and metals can be deposited by evaporation, sputtering, laser ablation, and chemical vapor deposition. A thickness ranging from 10 to 1000 nm is useful, and the preferred range is from 30–500 nm.

Organic layer structure 15 either has a single layer acting as a light emitter or a multilayer structure, including a light emitter and carrier-confinement layers. For instance, a useful structure includes an undoped and doped Alq layer as the emitter and a diamine layer for hole-transporting, as described in U.S. Pat. Nos. 5,294,869, and 5,151,629. Other materials suitable for use as light emitters include poly (paraphenylene vinylene) (PPV), PPV copolymers and derivatives, polyaniline, poly(3-alkylthiophene), poly(3-octylthiophene), poly(paraphenylene), and fluorescent dyes and pigments. Organic layer structure 15 can be prepared by thermal evaporation or spin-coating from a solution.

Top electron-injecting electrode 17 acts as an transmissive electron injector with a good stability against atmospheric oxidation. The electrode is a bilayer having a thin fluoride layer 17a and a thick conductive overlayer 17b. The inner layer, that is the layer in contact with the organic EL layer, is an essential part in this invention. The materials must have a low electron affinity or a strong dipole character. These are critical characteristics of the possible material choices. Besides fluorides and oxides of alkali and alkaline earth metals, other candidates may include their mixture, chlorides, iodides, and tellurides. The outer layer is also important to this invention. The layer must be conductive and transparent. The materials can be selected from the groups of oxides, nitrides, and sulfides. Suitable metal oxides include indium-tin-oxide, aluminum- or indium-doped zinc oxide, tin oxide, magnesium-indium-oxide, nickel-tungsten oxide, and cadmium-tin-oxide. Suitable nitrides include gallium nitride, indium nitride, or mixtures of Group III sulfide includes Group II sulfides such as ZnS. In some cases, a thin metal layer may be used as the outer layer to form a semi-transparent cathode. Suitable metals include gold, silver, aluminum, nickel, palladium, and platinum. When a thin metal layer is used for electron-injecting, a transparent encapsulating layer may be needed to protect the organic layered structure from moisture attack.

In accordance with this invention, the thickness of the nonconductive layer should be from 0.3 to 5.0 nm, preferably 0.5 to 1.0 nm. When the thickness is below 0.3 nm, the layer can not fully cover its underlying organic layer. When the thickness is above 5.0 nm, the applied current can not pass through the bilayer into the organic layer. A useful range of the conductive layer thickness is from 10 to 1000 nm, preferably 50–500 nm. Electrode 17 can be deposited by many conventional means, such as evaporation, sputtering, laser ablation, and chemical vapor deposition.

The following examples are presented for a further understanding of the invention.

EXAMPLE 1

An organic EL device satisfying the requirements of the invention was constructed in the following manner:

a) a transparent anode of indium tin oxide coated glass was ultrasonicated in a commercial detergent, rinsed in deionized water, degreased in toluene vapor, and contacted a strong oxidizing agent;

b) a 15 nm-thick CuPc layer was deposited on the anode;

c) a 60 nm-thick hole transporting NPB layer was deposited on the CuPc layer;

d) a 75 nm-thick electron transporting Alq layer was deposited on the NPB layer;

e) a 0.5 nm-thick lithium fluoride layer was deposited on the Alq layer; and f) a 120 nm-thick aluminum layer was deposited on the LiF layer.

All the materials were prepared by thermal evaporation from tantalum boats.

EXAMPLE 2

The same materials and processing procedures were employed as described in Example 1, except that the lithium fluoride layer was replaced by a magnesium fluoride, a calcium fluoride, a lithium oxide, or a magnesium oxide layer.

EXAMPLE 3

The same materials and processing procedures were employed as described in Example 1, except that the lithium fluoride layer was replaced by a germanium di-oxide or a silicon di-oxide layer.

EXAMPLE 4

An organic EL device was constructed in the following manner:

a) a transparent anode of indium tin oxide coated glass was ultrasonicated in a commercial detergent, rinsed in deionized water, degreased in toluene vapor, and contacted a strong oxidizing agent;

b) a 15 nm-thick CuPc layer was deposited on the anode;

c) a 60 nm-thick hole transporting NPB layer was deposited on the CuPc layer;

d) a 75 nm-thick electron transporting Alq layer was deposited on the NPB layer; and e) a 120 nm- thick aluminum layer or a 200 nm-thick $Mg_{0.9}Ag_{0.1}$ layer was deposited on the Alq layer.

All the materials were prepared by thermal evaporation from tantalum boats.

Figure 2:
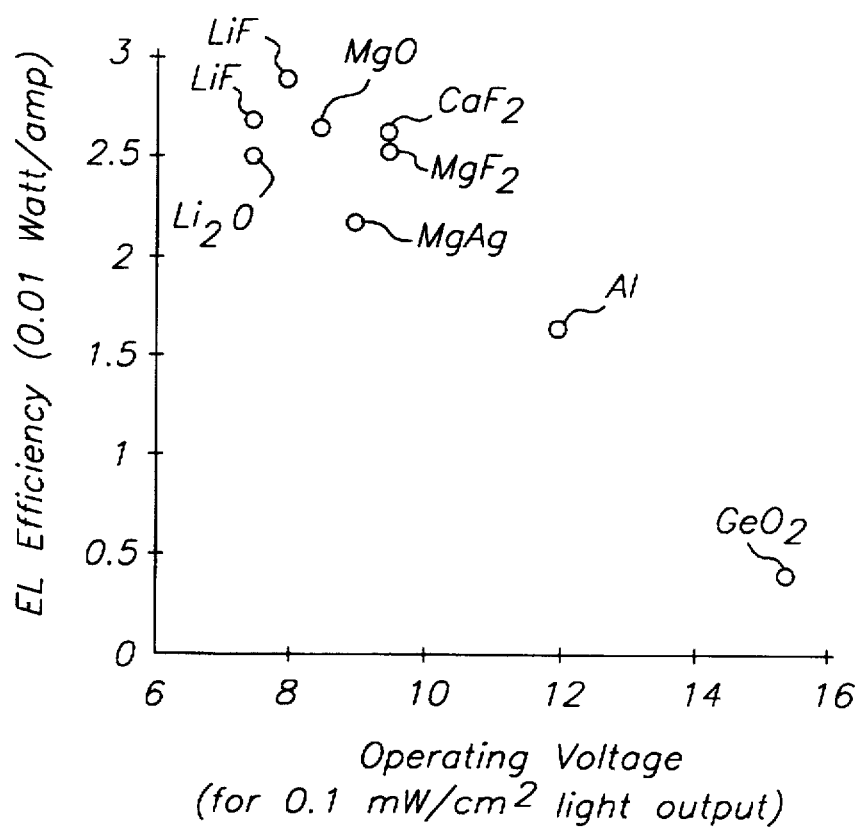
FIG. 2 is a plot of device characteristics (EL efficiency vs. operating voltage) using the bilayer cathode with Al as the conductive overcoat layer.

All the devices were evaluated with a positive potential applied to the anode and the cathode attached to ground to determine the characteristics of voltage-current and current-light emission, and the results are summarized in FIG. 2. In the plot, the horizontal axis shows the drive voltage to generate a light output of 0.1 mW/cm$^2$, and the vertical axis shows the electroluminescence efficiency. The device with an aluminum cathode requires a drive voltage of approximately 12 V to generate a light output of 0.1 mW /cm$^2$, which is substantially higher than that of the device with a MgAg cathode. Occurring with the higher drive voltage is a lower EL efficiency. The difference is attributed to a higher work function of Al (4.3 eV) than that of Mg (3.7 eV). It is surprising, however, that the device performance with an Al cathode can be dramatically improved by interposing an one- to two- monolayer of LiF, MgF$_2$, CaF$_2$, Li$_2$O, or MgO between Alq and Al. For instance, with a bilayer athode (Al/LiF) the drive voltage is reduced to 7.4 V, and the EL efficiency is increased to 0.028 mW/cm$^2$. The results are much better than that with a MgAg cathode.

EXAMPLE 5

An organic EL device was constructed in the following manner:

a) a transparent anode of indium tin oxide coated glass was ultrasonicated in a commercial detergent, rinsed in deionized water, degreased in toluene vapor, and contacted a strong oxidizing agent;

b) a 0.5 nm-thick lithium fluoride layer was deposited on the ITO;

c) a 75 nm-thick electron transporting Alq layer was deposited on the LiF layer;

d) a 60 nm-thick hole transporting NPB layer was deposited on the Alq layer;

e) a 15 nm-thick CuPc layer was deposited on the NPB layer; and f) a 50 nm- thick silver layer was deposited on the CuPc layer.

EXAMPLE 6

An organic EL device was constructed in the following manner:

a) a transparent anode of indium tin oxide coated glass was ultrasonicated in a commercial detergent, rinsed in deionized water, degreased in toluene vapor, and contacted a strong oxidizing agent;

b) a 75 nm-thick electron transporting Alq layer was deposited on the ITO;

c) a 60 nm-thick hole transporting NPB layer was deposited on the Alq layer;

e) a 15 nm-thick CuPc layer was deposited on the NPB layer; and f) a 50 nm- thick silver layer was deposited on the CuPc layer.

Figure 3:
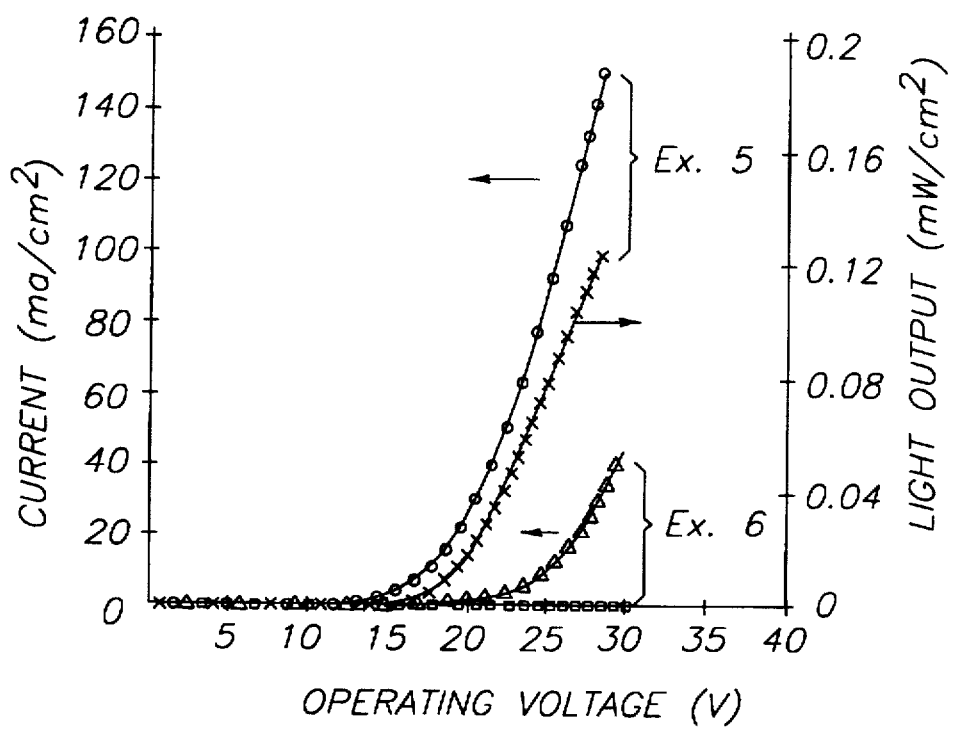
FIG. 3. is a plot of device characteristics (current and light output vs. operating voltage) using the bilayer cathode with ITO as the conductive overcoat layer.

The two devices were evaluated with a positive potential applied to the top electrode (Ag in Example 5 and Au in Example 6) and the bottom electrode (LiF/ITO in Example 5 and ITO in Example 6) attached to ground to determine the characteristics of voltage-current and current-light emission, and the results are summarized in FIG. 3. The device current in Example 6 was quite low although a high bias was applied, and no light output was detected. The device performance with an ITO cathode was found to be dramatically improved by interposing an one- to two-monolayer of LiF between Alq and ITO.

The invention has been described in detail with particular reference to preferred embodiments thereof, but it will be understood that variations and modifications can be effected within the spirit and scope of the invention.

| Parts List | |
|---|---|
| 10 | electroluminescent device |
| 11 | substrate |
| 13 | bottom hole-injecting electrode |
| 15 | organic layer structure |
| 17 | top electron-injecting electrode |
| 17a | fluoride |
| 17b | conductive overlayer |

We claim:

1. An electroluminescent device containing a transparent electron-injecting electrode, the electrode comprising:

a) a thin nonconductive layer contacting an electroluminescent layer, b) a conductive transparent overcoat layer; and c) the thickness of the nonconductive layer being selected so that the bilayer acts as an electron injecting contact, the bilayer providing stability against atmospheric corrosion.

2. The electrode of claim 1 wherein the thickness of the nonconductive layer is in the range of 0.3 to 5.0 nm.

3. The electrode of claim 1 wherein the nonconductive materials have a low electron affinity or a strong dipole character.

4. The electrode of claim 3 wherein said the nonconductive layer is selected from an alkali fluoride, an alkaline earth fluoride, an alkali oxide, or an alkaline earth oxide.

5. The electrode of claim 4 wherein said alkali fluoride includes lithium fluoride, sodium fluoride, potassium fluoride, rubidium fluoride, or cesium fluoride.

6. The electrode of claim 4 wherein said alkaline earth fluoride includes magnesium fluoride, calcium fluoride, strontium fluoride, or barium fluoride.

7. The electrode of claim 4 wherein said alkali oxide includes lithium oxide, sodium oxide, potassium oxide, rubidium oxide, or cesium oxide.

8. The electrode of claim 4 wherein said alkaline earth oxide includes magnesium oxide, calcium oxide, strontium oxide, or barium oxide.

9. The electrode of claim 1 wherein said conductive transparent overcoat layer can be selected from the group consisting of oxides, nitrides and sulfides.

10. The electrode of claim 9 wherein the nitride is GaN and the sulfide is ZnS.

11. The electrode of claim 5 wherein suitable metal oxides include indium-tin-oxide, aluminum- or indium-doped zinc oxide, tin oxide, magnesium-indium-oxide, nickel-tungsten oxide, or cadmium-tin-oxide.

12. An electroluminescent device comprising:

a) a single crystal semiconductor substrate;

b) a hole-injecting electrode having a work function with a value greater than 4.1 eV;

c) an organic electroluminescent layer; and d) a transparent electron-injecting electrode including a nonconductive layer on the organic layer and a conductive overcoat layer, the thickness of the nonconductive layer being in a range of 0.3 to 5.0 nm.

13. The device of claim 12 wherein said substrate is selected from the group consisting of Si, Ge, GaAs, GaP, GaN, GaSb, InAs, InP, InSb, and $Al_xGa_{1-x}As$, where x is from 0 to 1.

14. The device of claim 12 wherein said hole-injecting electrode is selected from the group consisting of noble and near-noble metals.

15. The device of claim 12 wherein said noble and near-noble metals include gold, silver, nickel, palladium, or platinum.

16. The device of claim 12 wherein said the organic electroluminescent layer is selected from the group of poly (paraphenylene vinylene) (PPV), PPV copolymers and derivatives, polyaniline, poly(3-alkylthiophene), poly(3-octylthiophene), poly(paraphenylene), or 8-hydroxyquinoline aluminum (Alq).

17. The device of claim 12 wherein the nonconductive materials have a low electron affmity or a strong dipole character.

18. The device of claim 17 wherein said the nonconductive layer is an alkali fluoride, an alkaline earth fluoride, an alkali oxide, or an alkaline earth oxide.

19. The device of claim 18 wherein said alkali fluoride includes lithium fluoride, sodium fluoride, potassium fluoride, rubidium fluoride, or cesium fluoride.

20. The device of claim 18 wherein said alkaline earth fluoride includes magnesium fluoride, calcium fluoride, strontium fluoride, or barium fluoride.

21. The device of claim 18 wherein said alkali oxide includes lithium oxide, sodium oxide, potassium oxide, rubidium oxide, or cesium oxide.

22. The device of claim 18 wherein said alkaline earth oxide includes magnesium oxide, calcium oxide, strontium oxide, or barium oxide.

23. The device of claim 12 wherein said conductive transparent overcoat layer is selected from the group consisting of oxides, nitrides, and sulfide.

24. The electrode of claim 23 wherein the nitride is GaN and the sulfide is ZnS.

25. The electrode of claim 23 wherein suitable metal oxides include indium-tin-oxide, aluminum- or indium-doped zinc oxide, tin oxide, magnesium-indium-oxide, nickel-tungsten oxide, and cadmium-tin-oxide.

* * * * *